United States Patent [19]

Mayer et al.

[11] 4,012,235

[45] Mar. 15, 1977

[54] SOLID PHASE EPITAXIAL GROWTH

[75] Inventors: James W. Mayer; Marc A. Nicolet; Silvanus S. Lau, all of Pasadena, Calif.

[73] Assignee: California Institute of Technology, Pasadena, Calif.

[22] Filed: Apr. 4, 1975

[21] Appl. No.: 565,129

[52] U.S. Cl. .............................. 148/1.5; 148/171; 148/180; 148/181; 148/185; 148/186; 148/188; 427/86

[51] Int. Cl.² ........................................ H01L 21/20

[58] Field of Search .......... 148/177, 180, 181, 185, 148/1.5, 171, 186, 188; 427/86

[56] References Cited

UNITED STATES PATENTS 3,886,002  5/1975  Akimov et al. .................... 148/185

*Primary Examiner*—R. Dean
*Attorney, Agent, or Firm*—Lindenberg, Freilich, Wasserman, Rosen & Fernandez

[57] ABSTRACT

A solid phase epitaxially grown semi-conductor is described wherein a thin film of a semi-conductor material together with a thin film dopant are transported through a metal film onto a substrate, using a temperature below the eutectic temperature for the material.

6 Claims, 5 Drawing Figures

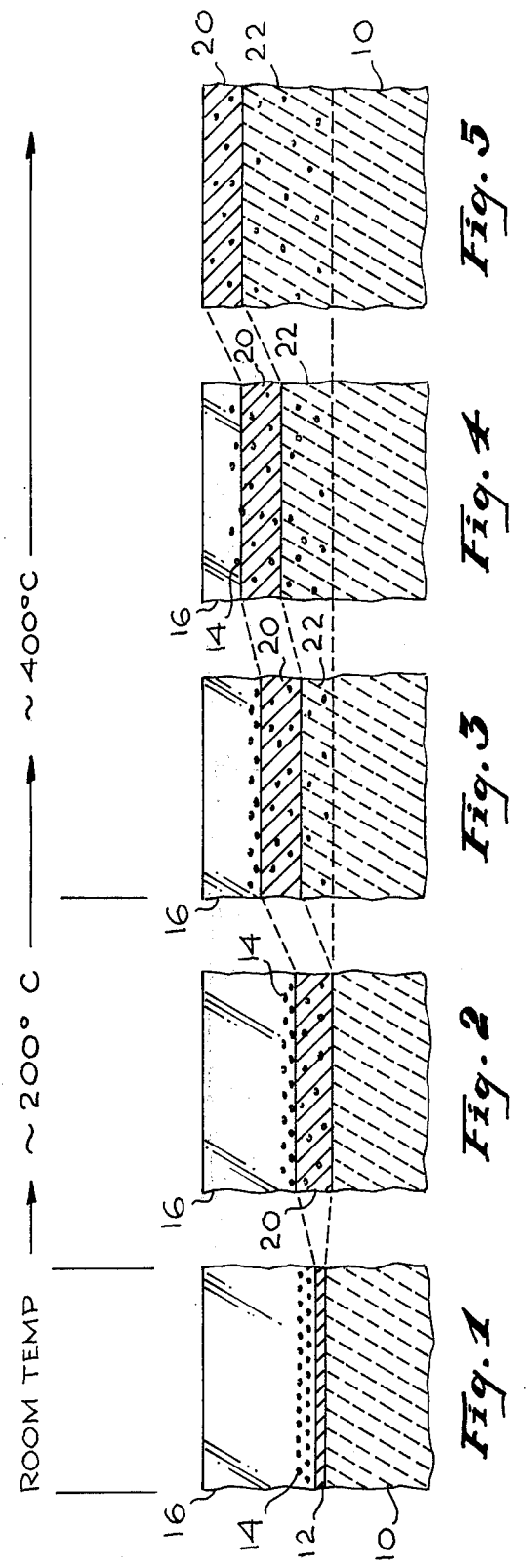

4,012,235

SOLID PHASE EPITAXIAL GROWTH

ORIGIN OF INVENTION

The Government has rights in this invention pursuant to Grant No. AER73-03265 awarded by the National Science Foundation, and Contract N00014-67-A-0094-0035 awarded by the Office of Naval Research.

BACKGROUND OF THE INVENTION

This invention relates to a method and means for producing semi-conductor devices and more particularily, to improvements in solid state epitaxially grown semiconductor devices.

In a U.S. Pat. No. 3,413,157, there is described a solid state epitaxial growth aluminum doped silicon by migration of a silicon through an aluminum thin film. A silicon surface is provided having a silicon dioxide layer thereover through which holes are etched to provide access to the silicon surface. A layer of aluminum is applied to cover the silicon dioxide surface as well as the holes therethrough. A layer of silicon is provided over the layer of aluminum. Another layer of aluminum is then provided over the silicon layer. The last aluminum layer is a contact layer. The substrate and the layers thereon are heated to approximately 565°, which is a temperature below the aluminum eutectic temperature, for a period of time, during which silicon will migrate through the evaporated aluminum layer and grow on the surface of the underlying silicon, through the holes, as an epitaxial layer. The solid state grown silicon layer will be doped to the maximum solubility of aluminum and silicon because of the dissolving of the aluminum into the silicon.

Other known techniques for growing doped layers, usually have a density gradient of impurity concentration with a maximum concentration at the surfaces decreasing with the distance from the surface. In the method described, there is no impurity gradient the doping being uniform throughout the grown layer.

A limitation upon this patented technique is that the epitaxially grown layer is always doped with the metal through which the growth takes place, which in the patented system is aluminum. If it were possible to grow an epitaxial layer in which an epitaxial layer is free of dopants or in which a dopant may be selected to provide a semi-conductor with desired properties, a much more flexible and useful arrangement would be possible. Also, it may be desirable to have a layer which is not saturated with a dopant.

OBJECT AND SUMMARY OF THE INVENTION

An object of this invention is to provide a method and means for solid state epitaxial growth in which a desired dopant may be provided for the epitaxially grown layer.

Yet another object of this invention is the provision of a novel method and means for doping a solid state epitaxially grown layer.

The foregoing and other objects of the invention may be achieved by providing a substrate, comprised of a silicon crystal, for example. Over the cleansed crystal surface there is deposited a thin film of a metal which has the properties that it will permit passage therethrough of material to be grown as an epitaxial layer on the substrate and will not act as a dopant for the material to be grown as an epitaxial layer. Over this layer there is deposited a thin film of a material desired to be used as the dopant. Over the dopant layer there is deposited an amorphous or polycrystalline film of the material to be epitaxially grown, which for example can be silicon. Alternatively, these two separate films may be previously combined and then deposited as a single film.

The substrate and its film layers are then heated to a first temperature which is below the eutectic temperature to permit the metal layer to dissolve some of the amorphous layer, the dopant and the substrate. After a predetermined period of time, the substrate and the layers thereof are heated to a second higher temperature which is still below the eutectic temperature, to permit the transport and epitaxial growth of a doped layer of a semi-conductor material from the metal layer onto the surface of the substrate.

A BRIEF DESCRIPTION OF THE DRAWINGS

FIGS. 1 through 5 respectively illustrate schematically and in cross section the initial state of the substrate and layers thereover grown in accordance with this invention and the states which successively occur as the heat treatment progresses to grow an epitaxial layer on the substrate.

DESCRIPTION OF THE PREFERRED EMBODIMENT

By way of illustration, and not to serve as a limit upon the invention, a specific description of materials in practicing the method of the invention will be given. The substrate upon which epitaxial growth is desired, may be a single crystal for example, of silicon (<100->Si). In order to permit nucleation on the surface of this crystal, a clean interface at the surface is required. This may be achieved by cleaning the surface with organic solvents and then etching in an aqueous HF solution. The substrate is then immersed in a solution, such as $H_2O_2+(Na_4)OH+ H_2O$, to form a thin oxide layer over the surface. The substrate surface is then etched again in an aqueous HF solution, to remove the thin oxide layer.

Either the entire surface can be removed by the HF treatment, or predetermined areas thereof can be removed by coating the surface with a mask having holes therethrough, through which the HF can remove the oxide layer.

The substrate then is loaded in a film deposition system. First, a thin material layer of several hundred angstroms is deposited on the substrate surface. This material should have the property that it will permit epitaxial growth therethrough but will not itself act as a dopant. An example of such a material is palladium, but other materials such as vanadium, titanium, or nickel may also be used.

A thin doping layer is next deposited over the material layer. The doping layer also may be on the order of a few hundred angstroms and a dopant such as antimony is preferred, but other dopants such as phosphorus, aluminum, boron, gallium, indium, thallium, arsenic or bismuth may be used.

Over the thin doping layer, a thick amorphous or finely polycrystalline silicon layer is deposited.

A schematic illustration, in cross section, of the appearance of the substrate and the layers thereon is represented in FIG. 1. The crystal substrate 10 has a layer of palladium 12 deposited thereon. The dopant, antimony, constitutes the layer 14, and on top of the dopant layer, a thicker layer of amphorous or crystalline silicon 16 is represented. Heat treatment is then commenced. The substrate and the layers are raised to a temperature of between 200° and 300° C for an interval required to enable the formation of palladium silicide which is doped with antimony. This can take on the order of half hour or less. A cross sectional view of a slice through the substrate and layers after this treatment is represented in FIG. 2, wherein the palladium silicide layer 20, is now adjacent to the crystal surface.

At this time, the temperature of the crystal and the layers thereon may be raised to a temperature between 400° C and 600° C, or higher but still below the eutectic temperature. After a time on the order of 25 minutes or longer, a solid state eutectic growth commences to take place on the surface of the crystal, as represented in FIG. 3. This solid state eutectic growth 22, comprises silicon, which is doped with the vanadium. The longer this temperature is held the thicker the doped, silicon layer becomes. As illustrated by FIGS. 4 and 5, the temperature can be held until all of the amorphous silicon has been transferred through the palladium silicide and has become a part of the doped silicon layer.

It should be noted that temperatures shown above were specified for the example given. Temperatures may range from 150° to 700° C for an appropriate part of time, depending upon the metal and dopant system used. The temperature rise time used between initial and final heat treatment should be sufficiently slow to allow uniform epitaxial growth. For example, a rise time on the order of 0.2° C per minute may be used.

The layered structure may now be removed from the furnace. It has a PN junction. The remaining metal silicide and dopant impurities at the surface can form an ohmic contact to the epitaxial layer. The layered structure may now be used for a diode or for the usual type of transistor.

By way of an explanation of what occurs, but not to serve as a limitation, it is believed that the essence of the solid phase epitaxial growth consists in placing a material in a solid form, but in a state of energy higher than the single crystalline state of the substrate in close proximity to the surface of the crystal. If the crystal parameters of the substrate match those of the materials sufficiently well, the change in the external constraints of the system can induce motion of the atoms from the amorphous material toward the crystal material such that the material nucleates and grows epitaxially on the substrate. The higher energy material has been found to be an amorphous or polycrystalline film of silicon or germanium which is deposited by vacuum deposition. When germanium is used, a germanium crystal substrate is used. A clean interface at the nucleation front on the crystal is imparative, since very thin layers of foreign material can strongly interfere or totally supress solid phase epitaxial growth. The native oxide on the pure silicon single crystal, which is typically less than 10 atomic layers of $SiO_2$ is sufficient to inhibit solid phase epitaxial growth.

It is believed that the formation of the palladium silicide in the initial phase of the processing described herein, serves the main purpose of breaking through the surface of the substrate and uncovering a new interface below the original surface. This new interface is as free of impurities as can be, having never been exposed to external ambient. Once the palladium silicide is formed, it serves to transport the silicon layer and dopant onto the surface of the silicon crystal substrate.

If the doping layer is omitted, that is if on the silicon crystal substrate there is deposited the metal palladium film and thereover the silicon film, an epitaxial layer of silicon can be growth on the substrate, using the same two heating steps which have been described.

By way of further examples, a silicon substrate had a nickel film deposited thereon amorphous silicon was deposited on the nickel film. The previously described heating steps were used. An epitaxial layer of silicon was grown on the substrate, whose thickness was determined by the thickness of the nickel film and the length of time during which the heating step was maintained. Also, using a germanium substrate, a thin film of aluminum was deposited thereover. Amorphous germanium was deposited on the film of aluminum. The heating steps produced an epitaxial layer of germanium on the substrate.

There has accordingly been described and shown here a novel and useful system for producing a semiconductor device employing solid phase epitaxial growth. Both the type and quantity of dopant may be selected as desired, or if no dopant is used, epitaxial growth of, for the example given, a layer of silicon on the silicon substrate, is provided.

What is claimed is:
1. A method of growing epitaxially a doped silicon layer upon a silicon substrate comprising,
    depositing over said silicon substrate a first material layer selected from one of palladium, vanadium, titanium, and nickel,
    depositing over said first metal layer a doping layer of one of, antimony, phosphorus, aluminum, boron, gallium, indium, thallium, arsenic, and bismuth,
    depositing over said doping layer a layer of silicon,
    heating said substrate and layers to a first temperature below their eutectic point temperature until said silicon layer forms a silicide of said first metal layer, and
    heating said substrate and layers at a second temperature which is higher than the first temperature but still below said eutectic temperature to cause migration of said dopant and said silicon through said silicide layer and nucleation and growth thereof upon the surface of said crystal.
2. The method recited in claim 1 wherein the rate of bringing said substrate and said layers thereon up to said first temperature is on the order of 2° C per minute and the rate at which said substrate and layer is thereon are brought from said first temperature to said second temperature is also on the order of 2° C per minute.
3. The method of growing a semi-conductor device comprising
    cleaning the surface of a single crystal silicon substrate
    depositing a thin layer of palladium over said substrate surface,
    depositing a thin doping layer of antimony over said palladium surface,
    depositing a layer of silicon over said doping layer,
    heating said substrate and the layers thereon to a first temperature below their eutectic temperature at which said palladium layer will form a palladium silicide,
    heating said substrate and film deposited thereover at a second temperature below their eutectic temperature to enable migration of said dopant and silicon through said palladium silicide to form an epitaxially grown layer of doped silicon between the sur- face of said crystal and the boundary of said palladium silicide.

4. The method as recited in claim 3 wherein said layer of silicon is a fine polycrystalline silicon layer.

5. The method as recited in claim 3 wherein said layer of silicon is an amorphous layer.

6. A method of growing an epitaxial layer on a substrate comprising depositing a thin layer of a first material over a single crystal substrate, said first material being one of palladium, titanium, vanadium and nickel, said substrate being one of a group consisting of silicon and germanium, depositing a thin layer of a second amorphous material which is one of a group consisting of silicon and germanium, over said first material which second amorphous material is the same as said single crystal substrate but has a higher energy level than when in its single crystal form and which has the property that it can pass through said first material to form an epitaxial layer on said substrate while said first material is heated below its eutectic temperature, heating said substrate and the layers thereon to a first temperature which is below the eutectic temperature of said substrate and layers for a time required for said first material to dissolve some of said substrate and said second material, and heating said substrate and the layers thereon to a second temperature above the first temperature, but still below the eutectic temperature of said substrate and layers, for a time required to grow an epitaxial layer having a desired thickness on said substrate.

* * * * *